US010596592B2

(12) United States Patent
Southworth et al.

(10) Patent No.: US 10,596,592 B2
(45) Date of Patent: Mar. 24, 2020

(54) METHOD FOR COATING A SUBSTRATE AND ALSO A COATING SYSTEM

(71) Applicant: SUSS MicroTec Lithography GmbH, Garching (DE)

(72) Inventors: Darren Southworth, Garching (DE); Omar Fakhr, Garching (DE)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 0 days.

(21) Appl. No.: 15/631,498

(22) Filed: Jun. 23, 2017

(65) Prior Publication Data

US 2017/0368567 A1   Dec. 28, 2017

(30) Foreign Application Priority Data

Jun. 27, 2016   (NL) ..................................... 2017053

(51) Int. Cl.
| *B05D 3/12* | (2006.01) |
| *B05D 1/00* | (2006.01) |
| *G03F 7/16* | (2006.01) |
| *H01L 21/67* | (2006.01) |
| *B05D 3/00* | (2006.01) |
| *H01L 21/033* | (2006.01) |

(52) U.S. Cl.
CPC ............. *B05D 1/002* (2013.01); *B05D 1/005* (2013.01); *B05D 3/007* (2013.01); *G03F 7/162* (2013.01); *G03F 7/168* (2013.01); *H01L 21/6715* (2013.01); *H01L 21/0337* (2013.01)

(58) Field of Classification Search
CPC ........ B05D 1/005; B05D 1/002; B05D 3/007; G03F 7/162; G03F 7/168; H01L 21/6715; H01L 21/0337
USPC .......................................................... 427/240
See application file for complete search history.

(56) References Cited

U.S. PATENT DOCUMENTS

| 5,725,663 | A | * | 3/1998 | Parrette | ................... | B05C 11/08 |
| | | | | | | 118/319 |
| 5,762,709 | A | * | 6/1998 | Sugimoto | ............... | B05C 11/08 |
| | | | | | | 118/319 |
| 5,939,139 | A | * | 8/1999 | Fujimoto | ................ | B05C 11/08 |
| | | | | | | 118/52 |
| 2004/0126923 | A1 | | 7/2004 | Benson | | |
| 2009/0277379 | A1 | | 11/2009 | Ohmi et al. | | |
| 2010/0227056 | A1 | * | 9/2010 | Takayanagi | ....... | H01L 21/67051 |
| | | | | | | 427/240 |

(Continued)

FOREIGN PATENT DOCUMENTS

| EP | 1458015 A2 | 9/2004 |
| KR | 20100078033 A | 7/2010 |
| WO | 2011073840 A2 | 6/2011 |

*Primary Examiner* — Kirsten Jolley
(74) *Attorney, Agent, or Firm* — Hayes Soloway PC

(57) ABSTRACT

Method for coating a substrate with a coating material is described, in particular with a coating or photoresist, wherein said substrate is provided in said method. Said coating material is applied to said upper side of said substrate. A gas flow is generated, said gas flow being directed from said underside of said substrate to said upper side of said substrate, wherein said gas flow prevents a bead of said coating material forming on said edge of said upper side of said substrate or a previously existing bead is removed by means of said gas flow. In addition, a coating system is described.

12 Claims, 1 Drawing Sheet

(56) References Cited

U.S. PATENT DOCUMENTS

2011/0117283 A1* 5/2011 Hsueh ................ H01L 21/6715
427/425

* cited by examiner

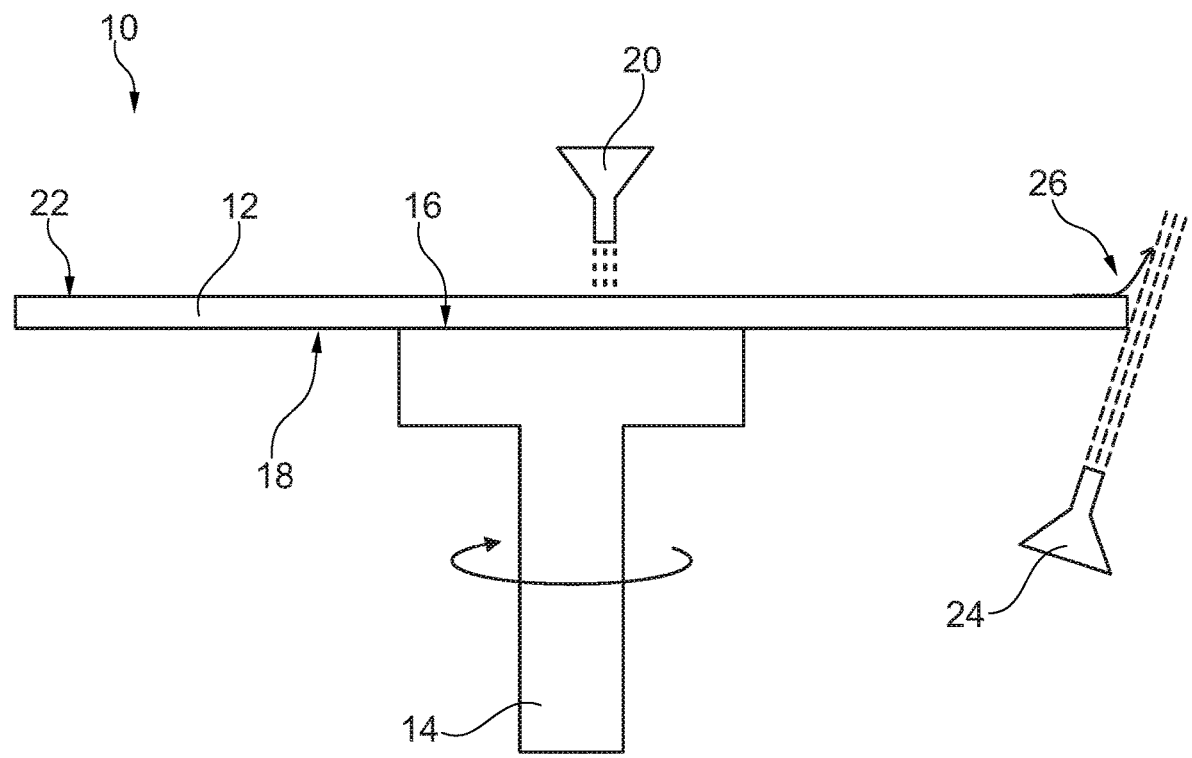

METHOD FOR COATING A SUBSTRATE AND ALSO A COATING SYSTEM

FIELD OF THE DISCLOSURE

The invention relates to a method for coating a substrate with a coating material, in particular a coating or photoresist and also a coating system for applying a coating to a substrate.

BACKGROUND

The invention relates in particular to a method and a system that are used to produce microstructured components by means of photolithography. Microstructured components are inter alia integrated circuits, semiconductor chips or micro-electromechanical systems (MEMS). A substrate (also known as a "wafer") is used for the photolithography method, said substrate being coated with a photoresist (also known as a "resist"). The coated substrate is subsequently exposed by means of a mask, wherein the physical and/or chemical characteristics of the photoresist at least in part change owing to the exposure.

The photoresist is applied to the substrate typically in a layer. It is extremely important that the applied resist layer is free of irregularities or particles. It is therefore known from the prior art that the coating is applied to the substrate by means of a rotation method ("spin coating") so that said coating is distributed as equally as possible on the surface of the substrate.

However, it has been proven that a bead in the coating can occur on the edge of the upper side of the substrate owing to the rotation method since the coating is pushed radially outwards as a result of the centrifugal force when rotating the substrate.

In the prior art, this coating bead is either removed manually or is removed by means of a solvent which however leads to an increased expenditure when producing the coated substrate or can lead to impurities.

In addition, a method for coating a substrate is known from KR 2010/0078033 A, wherein the coating material at the upper side of the substrate is exposed to a gas flow from an outflow device allocated to the upper side. The gas flow generates a pressure on the coating material to prevent the formation of a bead and to push away the coating material of a bead already formed. The gas flow generated in this way directly impinges on the upper side.

The photoresist represents the coating material in the case of the above mentioned specific field of application. In the case of other field of applications, it is possible however to use another coating material, by way of example a fluid material such as an aerogel. It is also possible to use an adhesive, an asphalt or clay as coating materials in their respective fields of application, said coating materials being applied to the substrate by means of a rotation method. It is also possible to apply dry materials in a rotation method so that said dry materials can also be used as coating materials.

In general, in the case of coating materials that are applied by means of a rotation method, it is possible that the coating material forms a bead on the edge of the respective substrate, which is undesired.

SUMMARY

The object of the invention is to prevent, with a limited expenditure, a bead of the coating material occurring or to effectively remove a bead using simple means during the coating method.

The object of the invention is inter alia achieved by means of a method for coating a substrate with a coating material, in particular with a coating or a photoresist, wherein initially a substrate is provided. The coating material is applied to the upper side of the substrate. In addition, a gas flow is generated that is directed from the underside of the substrate to the upper side of the substrate, wherein the gas flow prevents a bead of the coating material forming on the edge of the upper side of the substrate or a previously existing bead is removed by means of the gas flow.

The basic idea of the invention resides in preventing a bead of the coating material that generally occurs on the edge of the upper side of the substrate. It is therefore not absolutely necessary to subsequently remove a bead. This is achieved in a simpler manner by virtue of the fact that a suitable gas flow is directed at the lower edge of the substrate. It is also not necessary to subsequently process the coated substrate in this respect in another station. Since the gas flow is not directed directly at the upper side of the substrate, the surface of the substrate that is coated with the coating material is not impaired. If during the coating method a bead should occur, said bead can be removed in a simple manner by way of the gas flow. Accordingly, it is prevented that a bead forms permanently that would also be present on the surface of the substrate after completing the coating method.

One aspect of the invention provides that the substrate is rotated when applying the coating material so that the coating material that is applied is distributed essentially evenly on the upper side of the substrate. As a consequence, a surface of the substrate is provided that is as homogeneously coated as possible and free from irregularities.

A further aspect of the invention provides that the gas flow is generated before the coating material is dried. In the case of a coating being applied it is consequently ensured that the still moist, recently applied coating can be at least in part removed or moved by means of the gas flow in order to prevent the bead forming on the edge of the upper side of the substrate or to remove the previously existing bead.

In accordance with one aspect, it is provided that the gas flow impinges at least in part on the underside of the substrate, in particular the on edge region of the substrate. The gas flow is accordingly directed at the substrate in such a manner that said gas flow impinges in part on the underside of the substrate although the bead on the edge of the upper side is to be removed. The other part of the gas flow flows past the side of the substrate.

Alternatively, the entire gas flow can be guided past the side of the substrate without impinging in part on the substrate. For this purpose however, a fine adjustment is necessary between the substrate that is arranged and the gas flow in order to ensure that the entire gas flow flows past the substrate in such a manner that said gas flow prevents the permanent bead on the upper side.

In accordance with one embodiment variant, the gas flow generates a negative pressure on the upper side of the substrate, in particular in the edge region of the substrate. The bead is accordingly removed owing to the negative pressure that is generated. The principle of a jet pump is applied, in accordance with which a transporting flow is generated on the upper side of the substrate by means of the gas flow by way of which the bead is effectively prevented from forming on the edge of the upper side of the substrate. The coating material on the upper side accordingly represents the transported medium that is to be drawn in by the gas of the gas flow that is to be provided as a driving medium. If a bead has already formed, the coating material that forms the bead is removed by the transporting flow so that the bead that occurs when coating the substrate is removed during the coating procedure.

In addition, the gas flow can at least in part be generated in such a manner that a possible bead is drawn into the gas flow owing to the pressure that occurs from the edge region outwards. The coating material that would form a bead on the edge of the upper side of the substrate is accordingly swept away by the gas flow and is removed from the edge of the upper side of the substrate. As a consequence, the bead in the corresponding region on the upper side is effectively prevented from forming permanently.

In accordance with another embodiment variant, the gas flow is at least in part generated in such a manner that a possible bead is drawn from the edge region of the upper side to the underside of the substrate owing to the pressure that occurs. As a consequence, in turn the bead is effectively prevented from forming permanently on the edge of the upper side of the substrate. It is accepted that possible coating material remains stuck to the underside of the substrate and said material can optionally subsequently be removed.

In general, the gas flow can impinge on the substrate in such a manner that the coating material is drawn from the edge region outwards in the gas flow owing to the pressure that occurs and is drawn in part to the underside of the substrate.

The corresponding, different scenarios can be set by way of the angle and the speed of the gas flow by way of which the gas flow impinges on the substrate or flows past the side of the substrate.

A further aspect provides that the substrate is rotated when the gas flow is generated. As a consequence, it is ensured that the bead on the edge of the upper side of the substrate is removed in a homogenous manner since owing to the rotation of the substrate, the entire edge is exposed to the effect of the gas flow. In particular, the coating material can thus be applied to the upper side of the substrate distributed in an even manner and the bead on the edge of the upper side can be effectively prevented. The rotation speed of the substrate when applying the photoresist can however differ from the rotation speed with which the substrate is rotated if the gas flow impinges on the substrate. It is preferred that the substrate rotates slower when the gas flow is generated than when applying the coating. In particular, it is possible for the substrate not to rotate when the gas flow is generated.

In accordance with a further aspect it is provided that the gas flow is free from solvents and/or comprises nitrogen, in particular consists of nitrogen. As a consequence, it is ensured in a simple manner that the bead on the edge of the upper side of the substrate is effectively prevented or a previously existing bead is removed during the coating procedure. In addition, no further substances are introduced since the chamber is generally flooded with nitrogen.

In addition, the object of the invention is achieved by means of a coating system for applying a coating material to an upper side of a substrate, said coating system having an in particular rotatable substrate holder and outflow device for a gas flow, wherein the substrate holder comprises a support surface for a substrate that is arranged with its underside on the support surface of the substrate holder, wherein the outflow device is arranged in relation to the support surface in such a manner that the outflow device generates a gas flow that is directed starting from the underside of the substrate to the upper side of the substrate, wherein the outflow device generates the gas flow such that the gas flow prevents the formation of a bead of the coating material on the edge of the upper side of the substrate and/or removes an already existing bead.

It is possible with a coating system of this type to implement the method in accordance with the invention for coating a substrate since the outflow device that is present generates a corresponding gas flow that prevents a bead from forming on the edge of the upper side of the substrate when coating the substrate or prevents a previously existing bead from remaining at that location.

In general, the outflow device is arranged in such a manner that it generates a gas flow that is oriented from the support surface.

In addition, the outflow device is arranged below the plane of the support surface.

DESCRIPTION OF THE DRAWINGS

Further advantages and characteristics of the invention are evident in the description hereinunder and the single FIGURE to which reference is made.

DETAILED DESCRIPTION

In the FIGURE, a coating system 10 for applying a coating to a substrate 12 is illustrated so that a coated substrate is produced with which a photolithography method can be implemented in order to produce microstructured components such as integrated circuits, semiconductor chips or micro-electromechanical systems (MEMS).

The invention is accordingly explained hereinunder with reference to a specific application example of the invention, a coating system for microstructured components. The fundamental statements can however be transferred in a similar manner to the other application fields.

The coating system 10 comprises a rotatable substrate holder 14 that comprises a support surface 16 and the substrate 12 is arranged by way of its underside 18 on said support surface.

In addition, the coating system 10 comprises an application device 20 by way of which coating material of the coating that is to be applied is applied to the upper side 22 of the substrate 12. The coating material that is to be applied is typically in fluid form.

Furthermore, the coating system 10 comprises an outflow device 24 that is embodied in the illustrated embodiment separately from the substrate holder 14 and the application device 20. A gas flow can be generated by way of the outflow device 24 as is further explained hereinunder.

The substrate 12 is coated with the coating by means of the coating system 10, wherein a coating bead is simultaneously prevented from forming permanently on the edge 26 of the upper side 22 of the substrate 12.

The coating material is applied by way of the application device 20 to the upper side 22 of the substrate 12. The substrate holder 14 rotates at a predetermined angular velocity whereby the substrate 12 that is arranged on said substrate holder likewise rotates. The coating material that is applied is distributed as a consequence in a homogenous manner on the upper side 22.

The coating material migrates to the edge 26 of the upper side 22 of the substrate 12 and would form a bead of coating at that location owing to the centrifugal forces that occur when rotating the substrate 12, said centrifugal forces acting upon the coating material that is applied to the upper side 22.

In order to prevent this, a gas flow in particular a nitrogen gas flow is generated by way of the outflow device 24 and said gas flow is directed from the underside 18 to the upper side 22 of the substrate 12.

The gas flow impinges at least in part on the underside 18 of the substrate 12 and flows in part past the side of the substrate 12 that connects the underside 18 to the upper side 22. The gas flow generates a negative pressure on the upper side 22 in particular in its edge region 26 and the coating material that is still soft or moist is at least moved by the gas flow owing to said negative pressure. As a consequence, a coating bead is effectively prevented from forming on the edge 26.

If a coating bead has already formed, said bead is accordingly removed by the gas flow.

Irrespective of whether a coating bead (temporarily) occurs during the coating procedure, it is ensured with the coating method owing to the gas flow that a coating bead is not present at the end of the coating procedure.

In dependence upon the angle of the gas flow with respect to the upper side 22 of the substrate 12, it is possible to set whether the coating material is at least in part swept away by the gas flow and/or whether the coating material is at least in part displaced from the upper side 22 of the substrate 12 onto the lower side 18 of said substrate owing to the pressure that is generated. As a consequence, a coating bead is effectively prevented from forming permanently on the edge 26 of the upper side 22.

By way of example, it can be provided that a part of the coating material is swept away and another part of the coating material is displaced onto the underside.

The angle with which the gas flow that is generated by the outflow device 24 is generated in relation to the substrate 12 can preferably be set in order to generate different effects owing to the pressure that occurs.

Alternatively, the gas flow can also flow out of the outflow device 24 in such a manner that said gas flow does not impinge on the underside 18 of the substrate 12, but rather merely flows past the side of the substrate 12. However, a fine adjustment is necessary in order to generate on the edge 26 of the upper side 22 a negative pressure that prevents a coating bead on the edge 26 from forming or removes a previously existing coating bead.

In general, the outflow device 24 is arranged below the plane that is defined by means of the support surface 16. The gas flow that starts from the outflow device 24 is oriented in such a manner as to flow away from the support surface 16 possibly at an angle.

When generating the gas flow by way of the outflow device 24, the substrate 12 can likewise be rotated by way of the substrate holder 14 in order to ensure that the entire edge 26 is exposed to the effects of the gas flow in as homogenous a manner as possible, in other words is exposed to the negative pressure that is consequently generated on the upper side 22. The rotation speed is however clearly lower when generating the gas flow than the speed when applying the photoresist by way of the application device 20. By way of example, the rotation speed is less than ten revolutions per minute when the gas flow is being generated.

The rotation speed when generating the gas flow can even be zero. It is preferred that the gas flow is then generated by an annular outflow device 24 so that an essentially annular gas flow in each case flows along on the peripheral edge of the substrate 12.

It is possible with the method in accordance with the invention and the coating system 10 in accordance with the invention that coating beads do not form on the edge 26 of the upper side 22 of the substrate 12.

In general, gas mixtures other than pure nitrogen can be used in order to generate the gas flow. By way of example, an oxygen-nitrogen mixture, so-called clean dry air (CDA) or air.

The gas mixture is preferably solvent-free so that residues of the solvent cannot be deposited on the coated upper side 22 of the substrate 12.

It is preferred that the gas flows from the outflow device 24 with a pressure of multiple bar. As a consequence, inter alia the speed of the gas flow can be influenced, said speed being decisive in generating a negative pressure on the upper side 22 of the substrate 12.

Furthermore, it is possible that the coating in the edge 26 is even removed by means of a low rotation speed or a long total application time of the gas flow. Accordingly, so to speak a thinning of the coating that is applied in the edge 26 is achieved.

The outflow device 24 can comprise one outflow nozzle, multiple nozzles, an outflow slot, a so-called airblade or similar, by way of which inter alia another profile of the gas flow is achieved. This is in particular of importance for non-round substrates, by way of example square substrates.

In addition, the speed of the gas flow can be influenced by way of the specific embodiment of the outflow device 24.

If the coating material is swept away by the gas flow, the coating system 10 can comprise a retention tank for the coating material that is removed so that this coating material on the one hand does not contaminate the chamber and on the other hand can be reused.

In general, the gas flow that is generated by the outflow device 24 accordingly does not directly impinge on the upper side 22 of the substrate 12 but rather impinges on the underside 18 in an essentially perpendicular manner or the gas flow flows past essentially parallel to the axis of rotation of the substrate holder 14 on the substrate 12 in order to generate a negative pressure or a vacuum on the upper side 22 of the substrate 12, in particular on the edge 26 of the upper side 22.

The negative pressure ensures that the coating material that is collecting on the edge 26 does not form a permanent bead on the edge 26 that would also be present after the coating procedure. A coating bead that occurs temporarily during the coating procedure is accordingly removed by the gas flow.

The invention claimed is:

1. A method for coating a substrate with a coating material, said method having the following steps:
    a) Providing said substrate,
    b) Attaching said coating material to an upper side of said substrate, and
    c) Generating a gas flow with an outflow device that is directed from an underside of said substrate to said upper side of said substrate, wherein said gas flow generates a negative pressure that prevents a bead of said coating material forming on an edge of said upper side of said substrate or a previously existing bead is removed by means of said gas flow, wherein the gas flow that is generated by the outflow device is guided partly past the side of the substrate without impinging on the upper side of the substrate such that the bead on the upper side of the substrate is removed or prevented due entirely to the negative pressure that is generated.

2. The method as claimed in claim 1, characterized in that said substrate is rotated when applying said coating material so that said coating material that is applied is distributed essentially evenly on said upper side of said substrate.

3. The method as claimed in claim 1, characterized in that said gas flow is generated before said coating material has dried.

4. The method as claimed in claim 1, characterized in that said gas flow impinges at least in part on said underside of said substrate.

5. The method as claimed in claim 1, characterized in that said gas flow impinges on an edge region of said substrate.

6. The method as claimed in claim 1, characterized in that said gas flow generates a negative pressure in an edge region of said substrate.

7. The method as claimed in claim 1, characterized in that said gas flow is generated at least in part in such a manner that a possible bead is drawn from an edge region outwards into said gas flow owing to said pressure that occurs.

8. The method as claimed in claim 1, characterized in that said gas flow is generated at least in part in such a manner that a possible bead is drawn from said edge of said upper side onto said underside of said substrate owing to said pressure that occurs.

9. The method as claimed in claim 1, characterized in that said substrate is rotated when said gas flow is generated.

10. The method as claimed in claim 1, characterized in that said gas flow is free from solvents and/or comprises nitrogen.

11. The method as claimed in claim 10, characterized in that said gas flow consists of nitrogen.

12. A method for coating a substrate with a coating material, said method having the following steps:
providing said substrate,
attaching said coating material to an upper side of said substrate, and
generating a gas flow from an underside of said substrate, partly past a side of the substrate to said upper side of said substrate without impinging on said upper side of said substrate,
generating a transporting flow on the upper side of substrate caused entirely by negative pressure from the gas flow, wherein solely said transporting flow prevents a bead of said coating material forming on an edge of said upper side of said substrate or removes a previously existing bead.

\* \* \* \* \*